US012590855B2

(12) United States Patent
Yasui et al.

(10) Patent No.: US 12,590,855 B2
(45) Date of Patent: Mar. 31, 2026

(54) STRAIN SENSOR, FUNCTIONAL FILM, AND METHOD FOR MANUFACTURING SAME

(71) Applicant: NITTO DENKO CORPORATION, Ibaraki (JP)

(72) Inventors: Satoshi Yasui, Ibaraki (JP); Katsunori Shibuya, Ibaraki (JP); Kazuhiro Nakajima, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 217 days.

(21) Appl. No.: 18/034,510

(22) PCT Filed: Oct. 25, 2021

(86) PCT No.: PCT/JP2021/039327
§ 371 (c)(1),
(2) Date: Apr. 28, 2023

(87) PCT Pub. No.: WO2022/092033
PCT Pub. Date: May 5, 2022

(65) Prior Publication Data

US 2024/0003762 A1 Jan. 4, 2024

(30) Foreign Application Priority Data

Oct. 30, 2020 (JP) ................................. 2020-182216

(51) Int. Cl.
*G01L 1/22* (2006.01)
*C23C 14/00* (2006.01)
(Continued)

(52) U.S. Cl.
CPC ........ *G01L 1/2287* (2013.01); *C23C 14/0036* (2013.01); *C23C 14/0641* (2013.01); *C23C 14/34* (2013.01)

(58) Field of Classification Search
CPC ............... G01L 1/2287; C23C 14/0036; C23C 14/0641; C23C 14/34
(Continued)

(56) References Cited

U.S. PATENT DOCUMENTS 11,788,827 B2 * 10/2023 Takata ..................... G01B 7/18
428/411.1
11,796,404 B2 * 10/2023 Toda .................... H05K 1/0393
(Continued)

FOREIGN PATENT DOCUMENTS

CN 1847463 A 10/2006
CN 104838453 A 8/2015
(Continued)

OTHER PUBLICATIONS

Kobayashi, X-ray thin-film measurment techniques, The Rigaku Journal, 26(1), 2010, p. 9 (Year: 2010).*
(Continued)

*Primary Examiner* — Stephanie E Bloss
*Assistant Examiner* — Kevin C Butler
(74) *Attorney, Agent, or Firm* — Hauptman Ham, LLP

(57) ABSTRACT

A functional film includes a strain resistance film provided on one principal surface of a flexible insulating base. The strain resistance film is a chromium nitride thin-film having a thickness of 150 nm or less. In an X-ray diffraction chart with a CuKα ray as an X-ray source, the strain resistance film has an intensity ratio $I_2/I_1$ of 0.001 or more, where the intensity ratio $I_2/I_1$ is a ratio of the intensity $I_2$ of the second peak in a range in which 2θ is 60° to 65° to the intensity $I_1$ of the first peak in a range in which 2θ is 43° to 45°. The strain resistance film is less liable to crack due to bending, and has a high gauge factor. The functional film is suitably used for a strain sensor.

10 Claims, 1 Drawing Sheet

(51) Int. Cl.
  *C23C 14/06* (2006.01)
  *C23C 14/34* (2006.01)

(58) Field of Classification Search
  USPC ......................................................... 73/774
  See application file for complete search history.

(56) References Cited

U.S. PATENT DOCUMENTS

| | | | |
|---|---|---|---|
| 2015/0325345 A1 | 11/2015 | Fujita et al. | |
| 2020/0325571 A1 | 10/2020 | Asakawa et al. | |
| 2020/0340870 A1 | 10/2020 | Takata et al. | |
| 2021/0003378 A1 | 1/2021 | Asakawa et al. | |

FOREIGN PATENT DOCUMENTS

| | | | | | |
|---|---|---|---|---|---|
| EP | 3690387 A1 | * | 8/2020 | ......... | C23C 14/0063 |
| JP | H6-300649 A | | 10/1994 | | |
| JP | H7-306002 A | | 11/1995 | | |
| JP | H10-270201 A | | 10/1998 | | |
| JP | WO2008143011 A1 | * | 8/2010 | .............. | G01K 7/18 |
| JP | 2014-74661 A | | 4/2014 | | |
| JP | 2015-31633 A | | 2/2015 | | |
| JP | 2016074934 A | * | 5/2016 | | |
| JP | 6159613 B2 | * | 7/2017 | | |
| JP | 2019-66312 A | | 4/2019 | | |
| JP | 2019082426 A | * | 5/2019 | .............. | G01B 7/20 |
| JP | 2019-204874 A | | 11/2019 | | |
| JP | 6793103 B2 | * | 12/2020 | ......... | C23C 14/0063 |
| JP | 7025995 B2 | * | 2/2022 | | |
| JP | 7638081 B2 | * | 3/2025 | | |
| KR | 10-2008-0078619 A | | 8/2008 | | |
| WO | WO-2019065740 A1 | * | 4/2019 | ......... | C23C 14/0063 |
| WO | 2019/098072 A1 | | 5/2019 | | |
| WO | WO-2019088120 A1 | * | 5/2019 | .............. | G01B 7/20 |

OTHER PUBLICATIONS

Wie et al, High resolution X-ray diffraction characterization of semiconductor structures, Materials Science and Engineering Reports a Review Journal, R13 (1994) 1-56 (Year: 1994).*

Chung et al., Characteristics of Chromium Nitride Thin-Film Strain Gauges, Sensors and Materials, vol. 13, No. 1 (2001) 013-023 (Year: 2001).*

Bennett et al, Calibration of X-Ray Measurement of Strain, U. S. Department of Commerce National Bureau of Standards, Research Paper RP1874 vol. 40, Apr. 1948, p. 9 (Year: 1948).*

Harrington et al., Back-to-Basics tutorial: X-ray diffraction of thin films, Journal of Electroceramics https://doi.org/10.1007/s10832-021-00263-6 (2021) 47:141-163 (Year: 2021).*

Singh et al., Measurement by X-Ray Diffraction of Macro-Stresses and Micro-Stresses in Titanium and a Titanium Alloy, Directors of Westland Aircraft Ltd., pp. 743-754 (Year: 1972).*

Suzuki et al., Lecture Note on Solid State Physics x-ray diffraction, Department of Physics, State University of New York at Binghamton , Jan. 2007 (Year: 2007).*

Notification of Transmittal of Translation of the International Preliminary Report on Patentability for corresponding international application PCT/JP2021/039327 mailed on May 11, 2023 (5 pages).

International Search Report issued for corresponding International Patent Application No. PCT/JP2021/039327 on Jan. 11, 2022, along with an English Translation (5 pages).

Written Opinion issued for corresponding International Patent Application No. PCT/JP2021/039327 on Jan. 11, 2022 (3 pages).

Office Action issued on Sep. 23, 2025 for corresponding Chinese Patent Application No. 202180074312.5, along with an English machine translation (15 pages).

Cao et al., "Effect of Nitrogen Flow Rate on Structure and Properties of CrN Thin Films", Journal of Qinghai Normal University (Natural Science), No. 1, 2016, pp. 10-13, along with an English translation (12 pages), cited in NPL No. 1.

* cited by examiner

STRAIN SENSOR, FUNCTIONAL FILM, AND METHOD FOR MANUFACTURING SAME

CROSS REFERENCE TO RELATED APPLICATION

This application is a National Stage of International Application No. PCT/JP2021/039327, filed on Oct. 25, 2021, which designates the United States and was published in Japan, and which is based upon and claims priority to Japanese Patent Application No. 2020-182216, filed on Oct. 30, 2020 in the Japan Patent Office. All of the aforementioned applications are hereby incorporated by reference in their entireties.

TECHNICAL FIELD

The present invention relates to a strain sensor including a patterned thin-film on a flexible insulating base, a functional film that is used for producing a strain sensor, and a method for manufacturing the functional film.

BACKGROUND ART

In a strain sensor, a phenomenon in which an electrical resistance of a sensor material changes depending on elastic strain is utilized, and strain and stress can be calculated on the basis of a resistance change $\Delta R$. The sensitivity of the strain sensor is determined by the gauge factor K of a sensor material. The gauge factor K is a ratio between longitudinal strain $\varepsilon=\Delta L/L$ and resistance change ratio $\Delta R/R$, and is defined by the following expression.

$$K=(\Delta R/R)/\varepsilon$$

When the gauge factor K is large, even small strain leads to a large resistance change $\Delta R$, and therefore the sensitivity of the strain sensor increases. When the gauge factor K is large, strain can be detected even if the overall resistance R of the sensor material is small, so that a length of sensor wiring can be shortened, thus being advantageous for miniaturization. It is known that while the gauge factor of a general metallic material is about 2, bulk metallic chromium has a gauge factor of about 26 to 28, and a chromium thin-film has a high gauge factor of about 15.

The sensor material of the strain sensor is required to have a low resistance change with respect to temperature change (temperature coefficient of resistance: TCR) in addition to a high gauge factor. Metallic chromium has a high gauge factor, but has large TCR and lacks stability.

As a strain sensor material having a high gauge factor and small TCR, chromium nitride (Cr—N alloy) obtained by adding a small amount of nitrogen to metallic chromium to form an alloy has been proposed. Patent Document 1 and Patent Document 2 show an example in which a strain resistance film formed of a chromium nitride thin-film having a thickness of about 300 to 400 nm is formed on a glass base by reactive sputtering with using a metallic chromium target and a small amount of nitrogen, in addition to argon, is introduced.

A flexible strain sensor has been proposed in which a sensor wiring is provided on a flexible insulating base for enabling application to measurement objects with various shapes. For example, Patent Document 3 discloses a strain sensor in which a chromium nitride thin-film having a thickness of 500 nm is provided as a strain resistance film on a zirconia substrate having a thickness of 20 to 200 μm. Patent Document 4 discloses a strain sensor in which a titanium thin-film as an underlayer is provided on a polyimide film having a specific thermal expansion coefficient, and a chromium nitride thin-film is provided thereon as a strain resistance film.

PRIOR ART DOCUMENTS

Patent Documents

Patent Document 1: Japanese Patent Laid-Open Publication No. 7-306002
Patent Document 2: Japanese Patent Laid-Open Publication No. 10-270201
Patent Document 3: Japanese Patent Laid-Open Publication No. 2014-74661
Patent Document 4: Japanese Patent Laid-Open Publication No. 2019-66312

SUMMARY OF THE INVENTION

Problems to be Solved by the Invention

A strain sensor can be formed by patterning a thin-film provided on an insulating base into a wiring having a predetermined shape, and disposing a cover material on the patterned thin-film as necessary. When a flexible insulating base is used, employment of a continuous deposition method such as roll-to-roll sputtering enhances productivity to contribute to cost reduction, because a functional film including a thin-film uniform in thickness and characteristics can be provided with a large length.

However, if a chromium nitride thin-film having a thickness equivalent to that in Patent Documents 1 to 4 is formed by a roll-to-roll method, cracks are generated in the thin-film, so that application as a resistance film of a strain sensor is difficult. On the other hand, if the thickness of the strain resistance film is reduced, the gauge factor tends to decrease, leading to deterioration of the sensor sensitivity.

In view of the above, an object of the present invention is to provide a functional film including a strain resistance film, which is hardly cracked by bending and has a high gauge factor, on a flexible insulating base, and to provide a strain sensor obtained by patterning the strain resistance film to form a sensor wiring.

Means for Solving the Problems

The present inventors have found that a chromium nitride thin-film having a specific diffraction peak in an X-ray diffraction chart exhibits a high gauge factor even with a small thickness is small, leading to the present invention.

A functional film for strain sensors includes a strain resistance film on one principal surface of a flexible insulating base. The flexible insulating base may be a resin film. The functional film for strain sensors may be provided as a roll-shaped wound body of a continuous length film. By patterning the strain resistance film, a strain sensor including a patterned sensor wiring on a flexible insulating base can be formed.

The strain resistance film is a chromium nitride thin-film having a thickness of preferably 150 nm or less. In an X-ray diffraction chart with a CuKα ray as an X-ray source, the strain resistance film has a first peak in a 2θ range of 43° to 45° and a second peak in a 2θ range of 60° to 65°. The intensity ratio of a peak intensity $I_2$ of the second peak to a peak intensity $I_1$ of the first peak, $I_2/I_1$, is preferably 0.001 or more.

The gauge factor of the strain resistance film is preferably 10 or more. The temperature coefficient of resistance of the strain resistance film is preferably −600 to 600 ppm/° C.

The strain resistance film is formed preferably by a sputtering method. A strain resistance film (chromium nitride thin-film) is formed by, for example, performing sputtering deposition with the use of a Cr target and introducing argon and nitrogen. Sputtering deposition of the strain resistance film may be performed by roll-to-roll sputtering.

In the sputtering deposition of the strain resistance film, an introduction amount of nitrogen is preferably 0.5 to 15 parts by volume based on 100 parts by volume of an introduction amount of argon. The deposition pressure in the sputtering deposition of the strain resistance film may be 0.20 Pa or less.

Effects of the Invention

The functional film of the present invention is suitable for formation of a strain sensor because the resistance film is hardly cracked and has a high gauge factor, and the functional film can contribute to enhanced sensitivity and miniaturization of the strain sensor.

MODE FOR CARRYING OUT THE INVENTION

[Configuration of Functional Film]

Figure 1:
FIG. 1 is a sectional view showing an example of a stacking configuration of a functional film.

FIG. 1 is a sectional view showing an example of a stacking configuration of a functional film used for forming a strain sensor, where a strain resistance film 10 is provided on one principal surface of a film base 50 as a flexible insulating base. The strain resistance film of the functional film 101 is patterned to form a strain sensor 110 shown in the plan view of FIG. 2.

<Film Base>

The film base 50 serves as a basis for forming the strain resistance film 10 as a sensor material. The film base 50 is a flexible insulating base, and may be transparent or opaque. The thickness of the film base is not particularly limited, and is generally about 2 to 500 μm, and may be about 10 to 300 μm or 20 to 200 μm.

For the material of the film base 50, various resin materials or thin glass plates having flexibility are preferable because they are applicable to formation of a thin-film by roll-to-roll sputtering. Examples of the resin material include polyesters such as polyethylene terephthalate, polyimide, polyolefins, cyclic polyolefins such as norbornene-based cyclic polyolefins, polycarbonate, polyether sulfone, polyarylates, polyether ether ketone, and polyphenylene sulfide. Polyimide or polyester is preferable from the viewpoint of heat resistance, dimensional stability, electrical characteristics, mechanical characteristics, chemical resistance properties, and the like.

In the film base 50, the dimension change with a temperature change is preferably small, and the thermal expansion coefficient in the range of 0 to 60° C. is preferably 50 ppm/° C. or less, more preferably 30 ppm/° C. or less, still more preferably 20 ppm/° C. or less.

The film base may have a hard coat layer (cured resin layer), an easily adhesive layer, an antistatic layer or the like provided on a surface thereof. A surface of the film base may be subjected to treatment such as corona discharge treatment, ultraviolet irradiation treatment, plasma treatment, sputtering etching treatment or the like for improving adhesion with a thin-film.

<Strain Resistance Film>

The strain resistance film 10 provided on the film base 50 is a resistor that functions as a sensor material in the strain sensor. The strain resistance film 10 is a chromium nitride thin-film.

The chromium nitride thin-film as the strain resistance film 10 is preferably a thin-film consisting of Cr, N and inevitable impurity elements. Examples of the inevitable impurity element include impurity metal elements contained in a chromium target, carbon, and oxygen. The content of elements contained in the chromium nitride thin-film, other than Cr and N, is preferably 1 atom % or less, more preferably 0.1 atom % or less, still more preferably 0.05 atom % or less.

The thickness of the strain resistance film 10 (chromium nitride thin-film) is preferably 150 nm or less. If the chromium nitride thin-film provided on the flexible film base has a large thickness, internal stress is large, so that the thin-film is easily cracked when the film is bent in roll-to-roll conveyance or the like. This makes it difficult to apply the film to a sensor material. From the viewpoint of reducing generation of cracks, the thickness of the chromium nitride thin-film is more preferably 120 nm or less, still more preferably 100 nm or less. The thickness of the chromium nitride thin-film may be 90 nm or less, or 80 nm or less.

The lower limit of the thickness of the chromium nitride thin-film is not particularly limited, and is generally 5 nm or more. When the thickness of the strain resistance film increases, the gauge factor tends to increase, and the sensitivity of the strain sensor is enhanced. Thus, the thickness of the chromium nitride thin-film is preferably 10 nm or more, more preferably 20 nm or more, still more preferably 30 nm or more. The thickness of the chromium nitride thin-film may be 40 nm or more, 45 nm or more, or 50 nm or more.

It is preferable that in an X-ray diffraction chart with a CuKα ray as an X-ray source, the strain resistance film has a diffraction peak in each of a $2\theta$ range of 43° to 45° and a $2\theta$ range of 60° to 65°. The ratio of a peak intensity $I_2$ of the diffraction peak in a $2\theta$ range of 60° to 65° to a peak intensity $I_1$ of the diffraction peak in a $2\theta$ range of 43° to 45°, $I_2/I_1$, is preferably 0.001 or more. When a diffraction peak is present in a $2\theta$ range of 60° to 65°, the gauge factor tends to increase. $I_2/I_1$ is preferably 0.01 or more, more preferably 0.05 or more. $I_2/I_1$ may be 0.1 or more, 0.2 or more, or 0.3 or more.

The chromium nitride thin-film functioning as a strain resistance film is a mixed crystal system containing CrN and/or $Cr_2N$ in a Cr matrix. The ratio of nitrogen atoms to chromium atoms (N/Cr) is preferably 0.01 to 0.1, more preferably 0.02 to 0.06. When the matrix of metallic chromium contains a small amount of nitrogen atoms, the temperature coefficient of resistance (TCR) can be set to a value close to 0 while the high gauge factor of metallic chromium is maintained. If the content of nitrogen atoms is excessively large, the gauge factor tends to decrease.

The metallic Cr is has stable α-Cr, and the α-Cr single crystal has a body-centered cubic lattice (bcc) structure with a lattice constant of 0.288 nm. In an X-ray diffraction chart with a CuKα ray as an X-ray source, a peak in $2\theta$ range of 43° to 45° (plane spacing of 0.201 to 0.210 nm) can be attributed to a diffraction peak of a (110) plane of α-Cr, and a peak in a 2θ range of 60° to 65° (plane spacing of 0.143 to 0.154 nm) can be attributed to a diffraction peak of a (200) plane of α-Cr.

A chromium nitride thin-film has a tendency that when the thickness increases, bulk characteristics increase, leading to an increase in gauge factor. However, as described above, a chromium nitride thin-film having a large thickness lacks flexibility, and is likely to be cracked by bending, and therefore unsuitable for roll-to-roll conveyance. If the thickness of a chromium nitride thin-film is reduced, cracking by bending is less likely to occur, but in general, the gauge factor tends to decrease. On the other hand, a chromium nitride thin-film having a diffraction peak of a lattice plane having a plane spacing of 0.143 to 0.154 nm (thought to be a (200) plane of α-Cr) tends to exhibit a high gauge factor even with a small thickness. Thus, both suppression of cracking and a large gauge factor can be achieved.

The gauge factor of the chromium nitride thin-film is preferably 10 or more, more preferably 11 or more. The gauge factor may be 12 or more, or 13 or more. The upper limit of the gauge factor is not limited. The gauge factor of bulk α-Cr is 26 to 28, and the gauge factor of the chromium nitride thin-film is generally smaller than the gauge factor of bulk α-Cr. The gauge factor of the chromium nitride thin-film may be 25 or less, or 20 or less.

In the chromium nitride thin-film, the change in resistance with a temperature change is preferably small. TCR of the chromium nitride thin-film is preferably −600 to +600 ppm/° C., more preferably −500 to +500 ppm/° C. TCR of the chromium nitride thin-film may be −400 ppm/° C. or more, −300 ppm/° C. or more, −200 ppm/° C. or more, −150 ppm/° C. or more, or −100 ppm/° C. or more, and may be 400 ppm/° C. or less, 300 ppm/° C. or less, 200 ppm/° C. or less, 150 ppm/° C. or less, or 100 ppm/° C. or less.

TCR of the chromium nitride thin-film is ideally 0. In a chromium nitride thin-film having a nitrogen content in a range of 5 atom % or less, TCR tends to become a larger negative value as the nitrogen content increases, and TCR tends to become a positive value when the nitrogen content is small.

The method for forming the chromium nitride thin-film is not particularly limited, and examples thereof include a sputtering method, a vacuum vapor deposition method, an electron beam vapor deposition method, and a chemical vapor deposition method (CVD). Among them, a sputtering method is preferable because it is possible to deposit a thin-film excellent in thickness uniformity. Particularly, when a roll-to-roll sputtering apparatus is used, and deposition is performed while a continuous length film base is continuously conveyed in the longitudinal direction, productivity can be improved. By continuously depositing a chromium nitride thin-film as a strain resistance film on a continuous length film base by roll-to-roll sputtering, a roll-shaped wound body of a continuous length functional film is obtained.

It is preferable that a roll-shaped film base is loaded in the sputtering apparatus, and then, inside of the sputtering apparatus is exhausted before the start of the sputtering deposition to obtain an atmosphere in which impurities such as an organic gas generated from the film base are removed. A degree of vacuum (degree of ultimate vacuum) in the sputtering apparatus before the start of the sputtering deposition is, for example, $1 \times 10^{-2}$ Pa or less, preferably $5 \times 10^{-3}$ Pa or less, and more preferably $1 \times 10^{-3}$ Pa or less.

For sputtering deposition of the chromium nitride thin-film, it is preferable to perform reactive sputtering with the use of a metallic Cr target and introducing nitrogen in addition to an inert gas such as argon. An introduction amount of nitrogen is preferably 0.5 to 15 parts by volume, more preferably 1 to 10 parts by volume based on 100 parts by volume of argon. The deposition pressure in the sputtering deposition is preferably 0.20 Pa or less, more preferably 0.15 Pa or less, still more preferably 0.10 Pa or less. The deposition pressure may be 0.01 Pa or more, 0.03 Pa or more, or 0.05 Pa or more.

When the introduction amount of nitrogen and the deposition pressure are in the above-described ranges and the thickness is 150 nm or less, a chromium nitride thin-film having a diffraction peak in a 2θ range of 60° to 65° (plane spacing of 0.143 to 0.154 nm) in an X-ray diffraction chart with a CuKα ray as an X-ray source is easily formed. Even when deposition is performed under the same conditions, a diffraction peak in a 2θ range of 60° to 65° is hardly observed if the thickness is large.

The thin-film is significantly influenced by an interface with the base in the initial stage of deposition, and tends to have characteristics closer those of a bulk as the thickness is increases. Thus, in general, the gauge factor tends to increase as the thickness increases. On the other hand, it is thought that by controlling the introduction amount of nitrogen and the deposition pressure, α-Cr with (200) plane orientation is generated with specific film growth occurring in the initial stage of deposition. Where the thickness of the chromium nitride thin-film in a range of 150 nm or less, particularly in a range of 100 nm or less, a chromium nitride thin-film having high (200) orientation and large $I_2/I_1$ is tend to be formed because the influence of film characteristics at the initial stage of deposition is dominant.

The substrate temperature during sputtering deposition can be appropriately set within a range which ensures that the film base has heat resistance. When the substrate temperature increases, crystallization is promoted, so that film characteristics are easily stabilized. Thus, the substrate temperature is preferably 30° C. or higher, more preferably 50° C. or higher, still more preferably 70° C. or higher. The substrate temperature may be 100° C. or higher, 120° C. or higher, or 130° C. or higher.

From the viewpoint of suppressing damage to the film base while stabilizing plasma discharge, the discharge power density is preferably 0.5 to 15 W/cm$^2$ and more preferably 1 to 10 W/cm$^2$.

The magnetic flux density of the target surface during sputtering film deposition is about 10 to 200 mT. When the magnetic flux density increases, $I_2/I_1$ tends to increase, resulting in formation of a thin-film having a high gauge factor. The magnetic flux density of the target surface is preferably 20 mT or more, more preferably 30 mT or more. The magnetic flux density of the target surface may be 40 mT or more, or 50 mT or more.

Heat treatment may be performed after deposition of the chromium nitride thin-film. By heating the chromium nitride thin-film on the film base, crystallinity may be enhanced, leading to stabilization of film characteristics. Reduction of lattice defects by rearrangement of atoms with the progress of crystallization of chromium by heating, and the like may contribute to stabilization of film characteristics.

When heat treatment is performed, the heating temperature is preferably 80° C. or higher, more preferably 100° C. or higher, still more preferably 120° C. or higher. The upper limit of the heating temperature may be determined in consideration of the heat resistance of the film base, and is generally 200° C. or lower, or 180° C. or lower. When a polymer film having high heat resistance, such as a polyimide film, or an inorganic film base such as a thin glass plate is used, the heating temperature may be above the range. The heating time is preferably 1 minute or more, more preferably 5 minutes or more, still more preferably 10 minutes or more. The time at which the heat treatment is performed is not particularly limited as long as the heat treatment is performed after deposition of the chromium nitride thin-film. For example, the heat treatment may be performed after the chromium nitride thin-film is patterned.

<Additional Layer>

The functional film may include an additional layer in addition to the film base 50 and the strain resistance film 10. For example, as described above, a hard coat layer may be provided on a surface of the film base 50. For example, when a hard coat layer is provided on a surface of a resin film, the hardness of the functional film tends to be improved, leading to enhancement of scratch resistance.

Fine particles may be contained in the hard coat layer. An average particle diameter (average primary particle diameter) of the fine particles is preferably about 10 nm to 10 μm. When the hard coat layer contains fine particles having an average particle diameter in the order of submicron or micrometer, such as about 0.5 μm to 10 μm, preferably about 0.8 μm to 5 μm, protrusions having a diameter in the order of submicron or micrometer are formed on the surface of the hard coat layer and the surface of thin-film disposed thereon, so that slipperiness, blocking resistance, and scratch resistance of the functional film tend to be improved When the hard coat layer contains fine particles having an average particle diameter of about 10 nm to 100 nm, preferably about 20 nm to 80 nm, very small irregularities tend to be formed on the surface of the hard coat layer, leading to improvement of adhesion to the strain resistance film 10.

The functional film may include an underlayer between the film base 50 and the strain resistance film 10. When an underlayer is provided on the film base 50 and a chromium nitride thin-film as the strain resistance film 10 is formed thereon, it is possible to suppress plasma damage to the film base 50 during deposition of the chromium nitride thin-film. In addition, by providing an underlayer, moisture, an organic gas and the like generated from the film base can be blocked to suppress ingress of impurities into the chromium nitride thin-film. Chromium is apt to form a self-oxidation film, and by providing an underlayer to block moisture, an organic gas and the like from the film base, oxidation of the strain resistance film can be suppressed.

The underlayer may be electroconductive or insulating. When the underlayer is a conductive inorganic material (inorganic conductor), the underlayer may be patterned together with a chromium nitride thin-film as a strain resistance film during production of a strain sensor. When the underlayer is an insulating material (dielectric material), the underlayer may be patterned, or is not required to be patterned.

Examples of the inorganic material include metal elements or semimetal elements such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Ni, Co, Rh, Ir, Pd, Pt, Cu, Ag, Au, Zn, and Cd, and alloys, nitrides, oxides, carbides, and nitrogen oxides thereof.

The underlayer may have actions of improving adhesion of a chromium nitride thin-film as a strain resistance film, controlling the crystallinity of chromium nitride (for example, promoting crystallization), and the like. The thickness of the underlayer is not particularly limited. When a conductor is provided as an underlayer, the thickness thereof is preferably sufficiently smaller than that of the strain resistance film 10, and preferably 10 nm or less, more preferably 5 nm or less.

The method for forming an underlayer is not particularly limited, and any of dry coating and wet coating can be adopted. When the chromium nitride thin-film is formed by a sputtering method, it is preferable that the underlayer is also formed by a sputtering method from the viewpoint of productivity. In addition, it is preferable to form the underlayer by a sputtering method, because a dense film is easily formed and thus an excellent effect of suppressing ingress of moisture and organic substances into the chromium nitride thin-film from the film base is exerted.

The functional film may have a top coat layer on the strain resistance film 10. The top coat layer may have an action as a protective film for preventing scratching and corrosion of the strain resistance film, an action of improving solder connectivity with a lead wiring, and the like.

[Strain Sensor]

Figure 2:
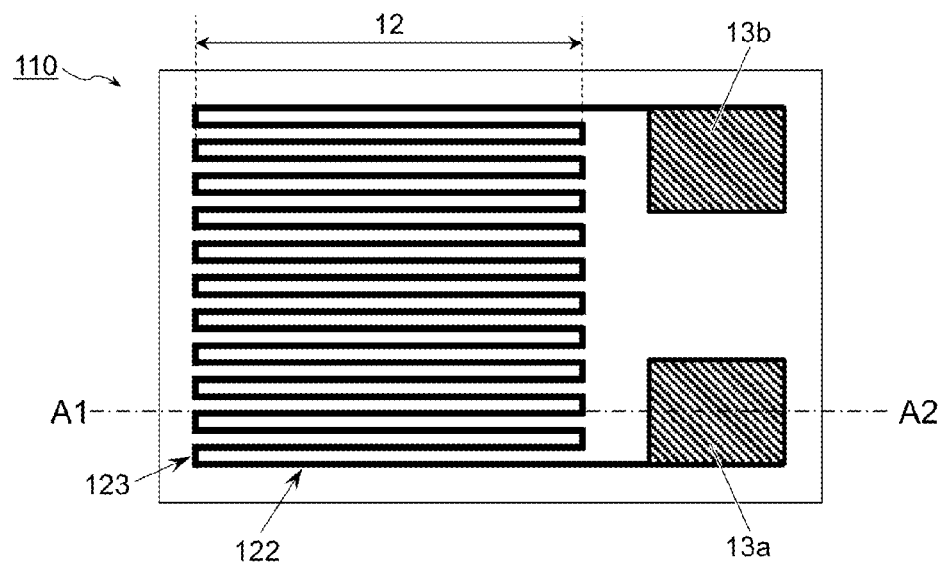
FIG. 2 is a plan view of a strain sensor.
Figure 3:
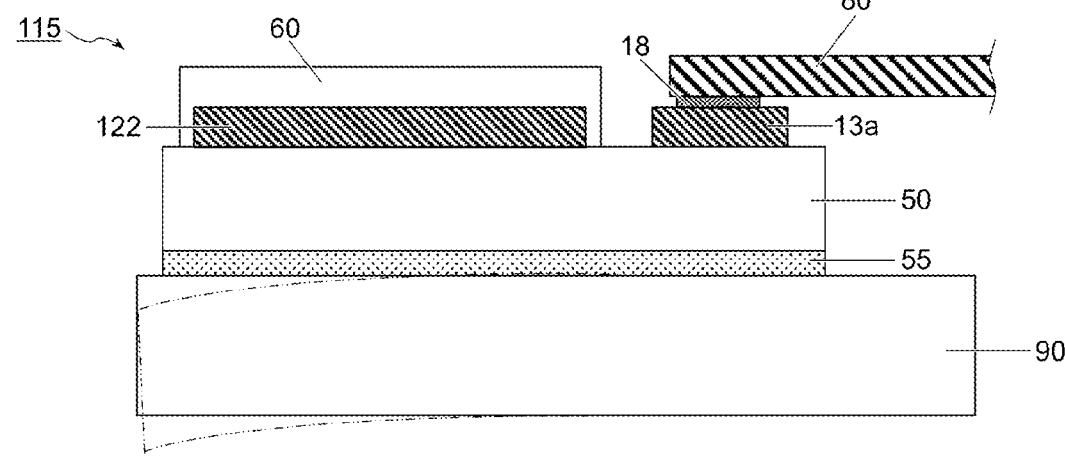
FIG. 3 is a sectional view showing a state in which a strain sensor is mounted on a specimen.

A strain sensor is formed by patterning the strain resistance film 10 of the functional film. FIG. 2 is a plan view of the strain sensor 110 according to one embodiment. FIG. 3 is a sectional view showing a state in which the strain sensor 110 is mounted on the specimen 90, which corresponds to a cross-section taken along line A1-A2 in FIG. 2.

The strain sensor 110 includes a sensor wiring portion 12 including sensor wirings 122 and 123 and a pair of terminal portions 13a and 13b on the film base 50. The sensor wirings and the terminal portions are all formed by patterning a strain resistance film of the functional film.

The sensor wiring portion 12 is formed by sensor wirings 122 and 123 in which a resistance film 10 is patterned into a thin wire shape. In the sensor wiring, a plurality of vertical electrodes 122 arranged in a striped pattern are connected at the end thereof through the horizontal wiring 123 to form a hairpin-shaped bent part, thereby having a zigzag pattern.

As the wiring width of the thin wire constituting the pattern shape of the sensor wiring portion 12 is smaller (the cross-sectional area is smaller) and the line length from one end to the other end of the sensor wiring of the sensor wiring portion 12 is larger, the resistance between two points is larger, and a resistance change amount is also larger according to strain. Therefore, the strain measurement accuracy is improved. By forming the zigzag wiring pattern as illustrated in FIG. 2, the area of the sensor wiring portion 12 can be decreased, and the length of the sensor wiring (line length from the terminal portion 13a connected to one end of the wiring and the terminal portion 13b connected to the other end of the wiring) can be increased. The pattern shape of the sensor wiring is not limited to the form as illustrated in FIG. 2, and may be a pattern shape such as a spiral shape.

The wiring width of the sensor wirings 122 and 123 and the distance (space width) between adjacent wirings may be set according to the patterning accuracy of photolithography. The wiring width and the space width are generally about 1 to 150 μm. The wiring width is preferably 3 μm or more and preferably 5 μm or more from the viewpoint of preventing disconnection of the sensor wiring. The wiring width is preferably 100 μm or less and more preferably 70 μm or less from the viewpoint of increasing the change in resistance and increasing the strain measurement accuracy. The space width is preferably 3 to 100 μm and more preferably 5 to 70 μm from the same viewpoints.

The terminal portions 13a and 13b extend from both ends of the sensor wiring, and are wider than the sensor wiring 122 in plan view. The terminal portion is a pair of electrodes for outputting a change in resistance value of the sensor wiring, which is caused by strain, to the outside, and for example, a lead wiring 80 for external connection and the like are joined to the terminal portion.

A method for pattering the resistance film is not particularly limited. Since the patterning is easy and accuracy is high, it is preferable to perform patterning by a photolithography method. In the photolithography, an etching resist corresponding to the shapes of the lead part and the thermometric resistor part are formed on the surface of the resistance film, the resistance film in a region in which the etching resist is not formed is removed by wet etching, and then, the etching resist is peeled off. The patterning of the resistance-film can also be performed by dry etching such as laser processing.

After the strain resistance film is patterned to form the sensor wiring, a cover layer 60 may be provided so as to cover the entire sensor wiring portion. When the cover layer 60 is provided, the sensor wiring can be protected from the outside, so that mechanical damage to the wiring and degradation of the wiring by moisture, gas and the like can be prevented.

The material of the cover layer 60 is not particularly limited as long as it is an insulating material, and for example, various resin materials exemplified as the resin material of the film base can be used. The cover layer 60 may be formed of a thermosetting or photocurable resin material. For example, after a strain resistance film is patterned to form the wiring, a curable resin composition may be applied so as to cover the sensor wiring portion 12, and cured by heating or irradiation with an active energy ray. A semi-cured film such as a dry film resist may be laminated on the sensor wiring portion 12, and then cured. The thickness of the cover layer 60 is not particularly limited, and is, for example, about 2 μm to 100 μm.

In FIG. 3, the film base 50 of the strain sensor 110 is bonded to a surface of the specimen 90 with an appropriate adhesive layer 55 interposed therebetween. The lead wiring 80 is connected to each of the terminal portions 13a and 13b through an appropriate electroconductive adhesive layer 18. Examples of the material of the electroconductive adhesive layer include solder. As the conductive adhesive material, a conductive paste or an electroconductive adhesive film containing a conductive material in a resin binder may be used.

The sensor wiring 122 is connected to an external resistance measurement circuit through the terminal portions 13a and 13b and the lead wiring 80. When the specimen 90 is deformed, so that strain is applied, the resistance value of the sensor wiring portion 12 changes. The amount of strain is calculated on the basis of a change in resistance value of the sensor wiring portion 12.

For example, when the specimen is deformed as indicated by a two-dot chain line in FIG. 3, tensile strain is applied to the longitudinal wiring 122, so that the cross-sectional area of the wiring decreases, leading to an increase in resistance of the sensor wiring portion. Conversely, when compressive strain is applied to the longitudinal wiring, the cross-sectional area of the wiring increases, so that the resistance of the sensor wiring portion decreases. From the amount of change in resistance, the amount of strain is calculated. Since the change in resistance by strain is small, in general, the lead wiring 80 is connected to a bridge circuit, the change in electric resistance is replaced by a change in voltage, and the change in voltage is amplified by an amplifier to detect distortion of the specimen.

EXAMPLES

Hereinafter, the present invention will be described more in detail by showing of examples, but the present invention is not limited to the following examples.

Example 1

A roll of a continuous length polyimide film was set in a roll-to-roll sputtering apparatus, the inside of the sputtering apparatus was evacuated to a degree of vacuum of $1 \times 10^{-3}$ Pa or lower, and a chromium nitride thin-film having a thickness of 60 nm was then deposited by reactive pulse DC sputtering (pulse width: 1 μs, frequency: 100 kHz) under the following conditions.

Target: Metallic chromium (500 mm×150 mm)
Input power: 5 kW (power density: 6.7 W/cm²)
Magnetic flux density (target surface): 100 mT
Substrate temperature: 150° C.
Introduced gas: Argon and nitrogen
Deposition pressure: 0.085 Pa

Examples 2 to 5 and Comparative Examples 1 to 3

The type of the base film, the magnetic flux density, the introduction amount of nitrogen, the deposition pressure, and the thickness of the chromium nitride thin-film were changed to those shown in Table 1. A chromium nitride thin-film was deposited on the film base by sputtering under the same conditions as in Example 1 except for the above. In Example 4, the magnet was changed, and deposition was performed under the condition of a magnetic flux density of 30 mT on the target surface. Details of the film bases used in examples are as follows.

PI-1: Polyimide film "KAPTON 500V" manufactured by Du Pont-Toray Co., Ltd.), thickness: 125 μm
PI-2: Polyimide film "KAPTON 200V" manufactured by Du Pont-Toray Co., Ltd.), thickness: 50 μm
PI-3: Polyimide film "KAPTON 200EN" manufactured by Du Pont-Toray Co., Ltd.), thickness: 50 μm PET: Polyethylene terephthalate film ("LUMIRROR 149 UNS" manufactured by Toray Industries, Inc.), thickness: 150 μm [Evaluation]
<Crack>

Whether or not cracks were present in the chromium nitride thin-film was visually observed.

<X-Ray Diffraction>

By using a powder X-ray diffractometer ("SmartLab" manufactured by Rigaku Corporation), out-of-plane measurement was performed under the following conditions, a peak intensity $I_1$ of a diffraction peak in a 2θ range of 43 to 45° and a peak intensity $I_2$ of a diffraction peak in a 2θ range of 60 to 65° were read from an XRD chart, and $I_2/I_1$ was calculated.

X-ray source: CuKα ray (wavelength: 0.15418 nm), 9 kW
Light-receiving PSA: 0.114°
Scan axis: 2θ/θ
Step width: 0.04°
Scan range: 20° to 70°
<Measurement of Gauge Factor and Temperature Coefficient of Resistance>
(Production of Strain Sensor)

A sample obtained by forming a chromium nitride thin-film as a strain resistance film on a film base was cut to a size of 10 mm×200 mm, and the chromium nitride thin-film was patterned into a stripe shape with a line width of 30 μm by laser patterning to produce a strain sensor having a pattern shape shown in FIG. 2.

(Measurement of Gauge Factor (Gf))

A strain sensor was drawn to a deformation amount (longitudinal strain) of 0.4% in a direction along longitudinal wiring by a universal material tester ("5967" manufactured by INSTRON). In this state, the resistance was measured by a high resistance/low current electrometer ("Model 6514 System Electrometer" manufactured by KEITHLEY Instruments). The gauge factor was calculated from a ratio of the resistance to that in an unloaded state.

(Measurement of Temperature Coefficient of Resistance (TCR))

In a small heating and cooling oven, a temperature of the strain sensor was set to 5° C., 25° C., and 45° C. Each of the terminal portions 13a and 13b was connected to a tester, a constant current was applied, and a voltage was read to measure a two-terminal resistance at each temperature. An average value of the TCR calculated from the resistance values at 5° C. and 25° C. and the TCR calculated from the resistance values at 25° C. and 45° C. was defined as a TCR of the chromium nitride thin-film.

[Evaluation Results]

Table 1 shows conditions for production of the functional films of Examples and Comparative Examples (type of film base, magnetic flux density of target surface, introduction amount of nitrogen, deposition pressure and thickness) and evaluation results (whether or not cracks are present, peak intensity in X-ray diffraction, gauge ratio (Gf) and temperature coefficient of resistance (TCR)). The amount $N_2$ in Table 1 is the amount of $N_2$ introduced (parts by volume) based on 100 parts by volume of the introduction amount of Ar. In Comparative Example 1, sensor characteristics were not evaluated because a large number of cracks were generated in the chromium nitride thin-film.

nitride thin-film can be formed which is excellent in flexibility, and is hardly cracked even when roll-to-roll deposition and roll-to-roll conveyance are performed.

In Comparative Example 2 and Comparative Example 3 where a diffraction peak was not observed in a 2θ range of 60 to 65° in an XRD chart, the gauge factor of the thin-film was less than 10. In Example 1 where sputtering deposition was performed at a lower pressure as compared to Comparative Examples 2 and 3, a diffraction peak was observed in a 2θ range of 60 to 65°, and the gauge factor exceeded 10.

In Examples 2 and 3 where the introduction amount of nitrogen was smaller than that in Example 1, $I_2/I_1$ was larger than that in Example 1, and a gauge factor higher than that in Example 5 was exhibited even though the thickness of the chromium nitride thin-film was half that in Example 5. In Examples 1 to 3, the gauge factor tended to increase with an increase in $I_2/I_1$. In Example 4 μm which deposition was performed at a magnetic flux density lower than that in Example 3, $I_2/I_1$ was small, and the gauge factor decreased.

From the above results, it can be seen that by reducing the thickness of the chromium nitride thin-film, generation of cracks can be suppressed, and by adjusting deposition conditions, a chromium nitride thin-film having a diffraction peak in a 2θ range of 60 to 65° is obtained, and a high gauge factor is exhibited even with a small thickness.

DESCRIPTION OF REFERENCE SIGNS

50 film base
10 strain resistance film (chromium nitride thin-film)
12 sensor wiring portion
122, 123 sensor wiring
13a, 13b terminal portion
55 adhesive layer
60 cover material
80 lead wiring

TABLE 1

| | | Deposition conditions | | | | | | | | Sensor characteristics | |
| | | Magnetic field | | Deposition | | | | XRD | | | TCR |
| | Base | strength (mT) | Amount of $N_2$ | pressure (Pa) | Thickness (nm) | Crack | $I_1$ | $I_2$ | $I_2/I_1$ | Gf | (ppm/° C.) |
|---|---|---|---|---|---|---|---|---|---|---|---|
| Example 1 | PI-1 | 100 | 10 | 0.085 | 60 | None | 467 | 212 | 0.45 | 12.9 | −579 |
| Example 2 | PI-3 | 100 | 6.0 | 0.085 | 60 | None | 1225 | 763 | 0.62 | 13.7 | −400 |
| Example 3 | PI-1 | 100 | 4.0 | 0.085 | 60 | None | 172 | 1137 | 6.63 | 15.5 | −96 |
| Example 4 | PI-2 | 30 | 4.0 | 0.085 | 60 | None | 1129 | 136 | 0.12 | 11.6 | −150 |
| Example 5 | PI-1 | 100 | 4.5 | 0.16 | 120 | None | 3885 | 14 | 0.004 | 13.3 | 25 |
| Comparative Example 1 | PI-1 | 100 | 4.5 | 0.16 | 180 | Present | 8379 | 32 | 0.004 | — | — |
| Comparative Example 2 | PET | 100 | 10 | 0.20 | 60 | None | 1706 | 0 | — | 9.5 | −495 |
| Comparative Example 3 | PET | 100 | 10 | 0.25 | 60 | None | 780 | 0 | — | 4.2 | −155 |

In Comparative Example 1 where a chromium nitride thin-film having a thickness of 180 nm was formed on the film base, cracks were generated over the entire thin-film. Cracks were not generated in Example 5 where a chromium nitride thin-film having a thickness of 120 nm was formed under the same conditions as in Comparative Example 1, and cracks were not observed in other Examples and Comparative Examples where a chromium nitride thin-film having a thickness of 60 nm was formed. From these results, it can be seen that by reducing the thickness, a chromium

18 electroconductive adhesive
90 specimen
101 functional film
110 strain sensor

The invention claimed is:

1. A functional film that is used for producing a strain sensor, the functional film comprising: a flexible insulating base; and a strain resistance film arranged on one principal surface of the flexible film base, wherein the strain resistance film is a chromium nitride thin-film having a thickness of 150 nm or less, and in an X-ray diffraction chart with a CuKα ray as an X-ray source, the strain resistance film has an intensity ratio $I_2/I_1$ of 0.001 or more, where the intensity ratio $I_2/I_1$ is a ratio of an intensity $I_2$ of a second peak in a $2\theta$ range of 60° to 65° to an intensity $I_1$ of a first peak in a $2\theta$ range of 43° to 45°.

2. The functional film according to claim 1, wherein the strain resistance film has a gauge factor of 10 or more.

3. The functional film according to claim 1, wherein the strain resistance film has a temperature coefficient of resistance of −600 to 600 ppm/° C.

4. The functional film according to claim 1, wherein the flexible insulating base is a resin film.

5. The functional film according to claim 1, wherein the functional film is provided as a wound body of a continuous length film.

6. A method for manufacturing the functional film as set forth in claim 1, wherein the strain resistance film is deposited by a sputtering deposition with using a Cr target and introducing argon and nitrogen.

7. The method according to claim 6, wherein the sputtering deposition is performed by roll-to-roll sputtering.

8. The method according to claim 6, wherein in the sputtering deposition, an introduction amount of nitrogen is 0.5 to 15 parts by volume based on 100 parts by volume of an introduction amount of argon.

9. The method according to claim 6, wherein a deposition pressure in the sputtering deposition is 0.20 Pa or less.

10. A strain sensor film comprising: a flexible insulating base; and a patterned sensor wiring arranged on one principal surface of the flexible film base, wherein the sensor wiring is a chromium nitride thin-film having a thickness of 150 nm or less, and in an X-ray diffraction chart with a CuKα ray as an X-ray source, the sensor wiring has an intensity ratio $I_2/I_1$ of 0.001 or more, where the intensity ratio $I_2/I_1$ is a ratio of an intensity $I_2$ of a second peak in a $2\theta$ range of 60° to 65° to an intensity $I_1$ of a first peak in a $2\theta$ range of 43° to 45°.

* * * * *